Figure 1:
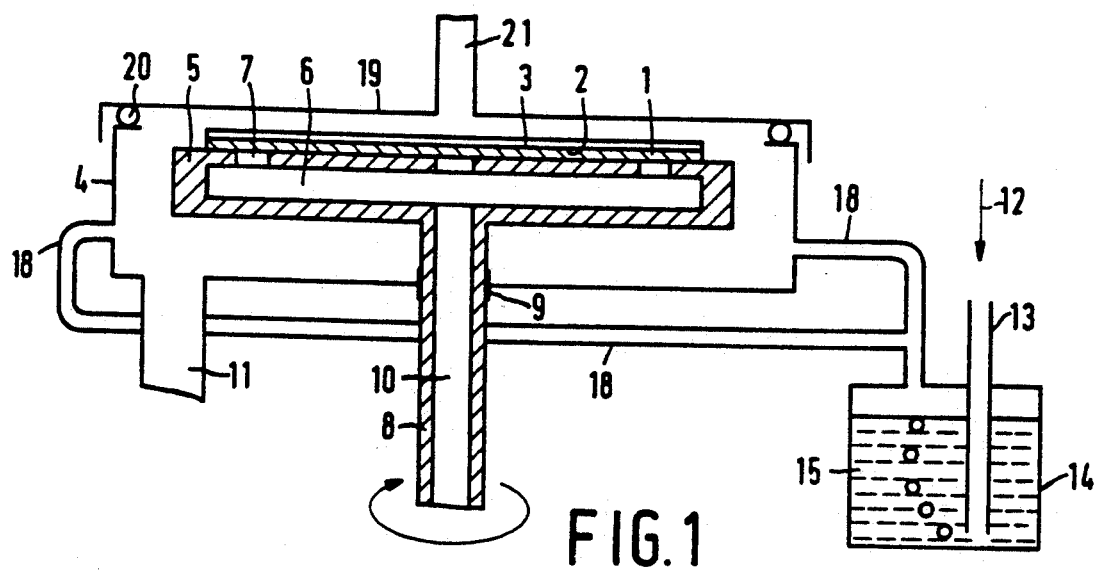

United States Patent [19]
Leenaars et al.

[11] Patent Number: 5,271,774
[45] Date of Patent: Dec. 21, 1993

[54] METHOD FOR REMOVING IN A CENTRIFUGE A LIQUID FROM A SURFACE OF A SUBSTRATE

[75] Inventors: Adriaan F. M. Leenaars; Johanna A. M. Huethorst; Johannes Marra, all of Eindhoven, Netherlands

[73] Assignee: U.S. Philips Corporation, New York, N.Y.

[21] Appl. No.: 845,782

[22] Filed: Mar. 5, 1992

Related U.S. Application Data

[63] Continuation of Ser. No. 662,152, Feb. 28, 1991, abandoned.

[30] Foreign Application Priority Data

Mar. 1, 1990 [NL] Netherlands ............... 9000484

[51] Int. Cl.$^5$ ............... B08B 5/00; B08B 7/00
[52] U.S. Cl. ............... 134/31; 134/32; 134/33
[58] Field of Search ............... 134/31, 32, 33, 37

[56] References Cited

U.S. PATENT DOCUMENTS 3,957,531  5/1976  Tipping et al. ............... 134/11

FOREIGN PATENT DOCUMENTS 1-68238  4/1982  Japan .
1-13432  6/1985  Japan .

OTHER PUBLICATIONS

JP 60-113432, "Processing Equipment of Semiconductor", Patent Abstracts of Japan, No. 266 (E-352), vol. 9, p. 111, Oct. 23, 1985.

*Primary Examiner*—Theodore Morris
*Assistant Examiner*—Zeinab El-Arini
*Attorney, Agent, or Firm*—Paul R. Miller

[57] ABSTRACT

A method is set forth of removing a liquid (3) from a surface (2) of a substrate (1), which is placed in a centrifuge (4) and is then subjected therein to a rotary movement, the substrate being rotated at such a speed that the liquid is centrifuged from the surface. According to the invention, the substrate is brought into contact in the centrifuge with a vapour of a material which is miscible with the liquid and which, when mixed therewith, yields a mixture having a surface tension which is lower than that of the liquid. Due to this step, the quantity of material remaining on the surface is strongly reduced.

13 Claims, 1 Drawing Sheet

METHOD FOR REMOVING IN A CENTRIFUGE A LIQUID FROM A SURFACE OF A SUBSTRATE This is a continuation of application Ser. No. 07/662,152 filed Feb. 28, 1991, now abandoned.

The invention relates to a method for removing a liquid from a surface of a substrate, in which the substrate is placed in a centrifuge and is then subjected therein to a rotary movement with the substrate being rotated at such a speed that the liquid is centrifuged from the surface.

Such a method may be used, for example, in the manufacture of integrated semiconductor circuits (IC's), of display screens comprising liquid crystals (LCD's), of electric circuits on boards of synthetic material (circuit boards) and of video and phono records (VLP's and CD's). In all these cases, substrates of semiconductor material, glass or synthetic material are often treated many times in a liquid, for example, in galvanic baths for deposition of metals, in etching baths for etching patterns into metal layers or into semiconductor material, in developing baths for developing exposed photolacquer layers and in rinsing baths for cleaning the substrates. Subsequently, the liquid should always be removed from the surface of the substrates.

BACKGROUND OF THE INVENTION

From the abstract of Japanese Patent Application No. 60-113431 published in "Patent Abstracts of Japan", No. 266 (E 352), Vol. 9, p. 111, 23-10-1985, a method is known of the kind mentioned in the opening paragraph, in which a slice-shaped semiconductor substrate is arranged in a centrifuge on a turntable and is then rotated rapidly about an axis transverse to its surface.

It has been found in practice that with the use of known methods described contaminations dissolved in the solution can remain on the surface of the substrate. These contaminations are often of metallic or organic nature and can be very disturbing during further steps of processing the substrate. Organic contaminations which locally remain on the surface may, for example, strongly delay or even locally prevent an etching treatment.

SUMMARY OF THE INVENTION

The invention has for its object to provide a method in which these disadvantages are obviated.

For this purpose, according to the invention, the method mentioned in the opening paragraph is characterized in that the substrate in the centrifuge is brought into contact with a vapour of a material which is miscible with the liquid and which, when mixed with this liquid, yields a mixture having a surface tension which is lower than that of the liquid.

As compared with the known method, the method according to the invention yields a considerably cleaner result. Comparison tests have shown that, when mixed vapour is introduced into the centrifuge, the quantity of material remaining on the substrate can be reduced by at least a factor 10.

Experiments in which a flow of gas containing the aforementioned vapour is passed over a surface of a substrate on which a liquid film is disposed have shown that the liquid film is split up into parts and that these parts are further contracted to liquid drops. When the flow of gas is interrupted, again a liquid film is formed. It is presumed that the Marangoni effect then plays a part and that the drop formation is due to local differences in surface tension in the liquid caused by supply of the vapour. Since, when the vapour is supplied, the liquid is contracted to smaller and hence thicker liquid parts, during treatment in the centrifuge the liquid will not only be held less strongly by the surface, but will also evaporate more slowly. During the treatment, due to the step according to the invention, a larger quantity of liquid will therefore be removed from the surface by centrifuging and a smaller quantity thereof will be removed by evaporation. Since a smaller quantity of liquid disappears from the surface by evaporation, also a smaller quantity of contaminations dissolved in the liquid will therefore remain on the surface.

According to the invention, the vapour is preferably brought into contact with the substrate in the unsaturated state. Thus, it is prevented that during treatment in the centrifuge vapour is condensed on the surface of the substrate. This condensed vapour will have to be removed by means of an additional drying treatment. Since vapour is extremely clean, the surface will then not be additionally contaminated, however. The use of unsaturated vapour therefor does not yield a cleaner surface, but renders the additional drying treatment superfluous.

The vapour can be brought in a simple manner into contact with the substrate in the unsaturated state in that this vapour is cooled to a temperature which is lower than that of the substrate.

Preferably, according to the invention, the substrate is brought into contact with the vapour of the material miscible with the liquid before it is subjected to the rotary movement in the centrifuge. Drops are then formed on the surface of the substrate before the rotary movement begins. The contraction of liquid to drops takes place much easier when the substrate is stationary than when the substrate rotates. In this manner, the surface becomes cleaner than when the supply of vapour is started only during the rotary movement.

As has already been stated before, substrates can be treated in different liquid baths. In practice, these baths mostly contain water, however. In these cases, preferably a vapour of an organic solvent is passed into the centrifuge. It has been found that the supply of vapour of many alcohols, glycols, aldehydes, esters and ketones can lead to a clean surface.

Preferably, when the substrate is brought into contact with the vapour this vapour is mixed with a carrier gas and, this mixture is then passed into the centrifuge. Thus, in a simple manner, unsaturated vapour can be passed into the centrifuge.

BRIEF DESCRIPTION OF THE DRAWINGS FIGURES

Figure 2:
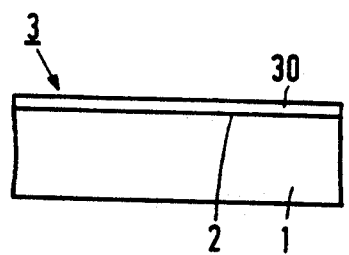
Figure 3:
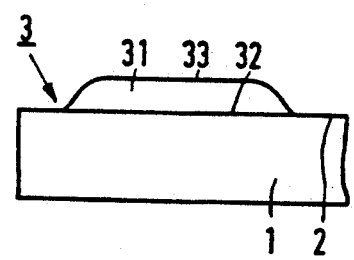
Figure 5:
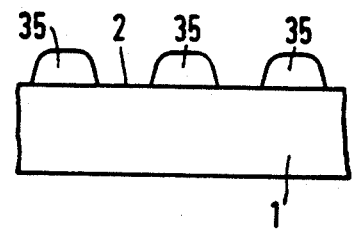
Figure 4:
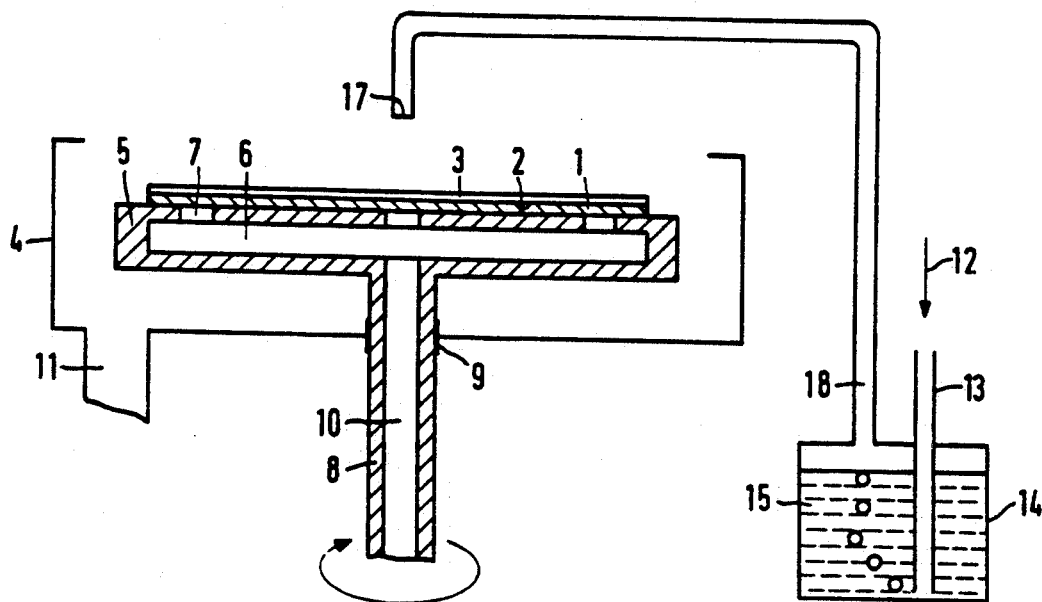

The invention will now be described more fully, by way of example, with reference to a drawing and a few embodiments. In the drawing:

FIG. 1 shows a diagrammatic cross-section of a centrifuge for carrying out the method according to the invention, FIGS. 2 and 3 show diagrammatically the substrate surface with liquid before and after supply of vapour to the centrifuge shown in FIG. 1, FIG. 4 shows a diagrammatic cross-section of a centrifuge with the supply of vapour different from that in the centrifuge shown in FIG. 1, and FIG. 5 shows diagrammatically the substrate surface with liquid after supply of the vapour to the centrifuge shown in FIG. 4.

DESCRIPTION OF THE INVENTION

A substrate 1, in this case a slice of silicon having a cross-section of 15 cm, which has a surface 2 on which a liquid 3 is disposed, is placed in a centrifuge 4 on a turntable 5. The turntable 5 is provided with a chamber 6, which communicates through ducts 7 with the surface 2. The turntable 5 is rotatably arranged in the centrifuge 4 on a rotary shaft 8 rotatable in a bearing 9. The rotary shaft 8 is provided with a duct 10, which communicates with the chamber 6. By the duct 10, the chamber 6 can be brought to a subatmospheric pressure so that the substrate 1 is sucked via the ducts 7 onto the substrate holder 5. The centrifuge is closed by a cover 19 engaging a rubber ring 20. The cover 19 is located at a distance of a few millimeters from the slice of silicon 1 and has a vapour outlet opening 21.

After the substrate 1 has been sucked onto the turntable 5, the latter is set into motion, the substrate 1 being rotated so rapidly that the liquid 3 is centrifuged from the surface 2. The liquid is further removed via a drain 11.

In this example, the substrate 1 is placed at the center of the turntable, but the liquid 3 may also centrifuged from the surface 2 of the substrate in an arrangement where several substrates are arranged on a larger turntable, or in an arrangement were a number of substrates are placed on a number of turntables at a certain distance one above the other. The centrifuge 4 may of course also be used to dry substrates other than silicon slices, such as glass plates and plates of synthetic material, on which, for example, electric circuits are provided.

According to the invention, the substrate 1 in the centrifuge is brought into contact with a vapour of a material which is miscible with the liquid on the substrate and, when mixed with this liquid, yields a mixture having a surface tension which is lower than that of the liquid itself. Thus, as will appear, a more satisfactory and more rapid drying of the substrate 1 is obtained.

It appears that the liquid 3, which, as is shown diagrammatically in FIG. 2, initially is present as a liquid film 30 on the surface 2 of the substrate 1, is split up, as is shown diagrammatically in FIG. 3, into a smaller, but thicker, liquid part 31. Such a liquid part 31 has a comparatively small contact surface 32 with the surface 2 and a comparatively small free surface 33. As a result, during its treatment in the centrifuge 4, the liquid 3 will not only be held less strongly by the surface 2, but will also evaporate more slowly. During the treatment, due to the supply of the vapour, a larger quantity of liquid will therefore be removed from the surface by centrifuging and a smaller quantity thereof will be removed by evaporation. Since a smaller quantity of liquid disappears from the surface by evaporation, also a smaller quantity of contaminations dissolved in the liquid will remain on the surface.

Preferably, according to the invention, the substrate 1 may be brought into contact with the vapour first before it is subjected to the rotary movement in the centrifuge 4. The contraction of the liquid 3 to a liquid part 31 takes place much easier when the substrate 1 is stationary than when the substrate rotates. Thus, a more satisfactory and more rapid drying of the substrate can be attained.

In practice, the liquid often is water. A satisfactory and rapid drying is then obtained if an organic solvent is used as the vapor material miscible with the liquid. Preferably, a carrier gas indicated diagrammatically by an arrow 12 is passed via a pipe 13 through a container 14 of this organic solvent 15. As a result, the carrier gas 12 is mixed with vapour of the solvent 15. The carrier gas 12 mixed with vapour of the solvent 15 is then passed through pipes 18 into the lower part of the centrifuge. This takes place in such a manner that the flow of gas of the mixture is small near the surface 2 of the substrate 1. The gas mixture is discharged through the opening 21. Thus, in a simple manner, unsaturated vapour is passed over the substrate.

According to the invention, the vapour is brought into contact with the substrate 1, preferably in the unsaturated state. As a result, vapour is prevented from being condensed on the substrate during the treatment in the centrifuge. Such condensed vapour would then have to be removed by means of an additional drying treatment.

In a simple manner, the vapour can be brought into contact with the substrate 1 in the unsaturated state when this vapour is cooled to a temperature which is lower than that of the substrate 1. This may be obtained, for example, when the solvent 15 in the container 14 is cooled in a usual manner to this lower temperature. Otherwise it has been found that, when the carrier gas 12 is passed through the solvent 15, this gives rise to a forced evaporation of the solvent 15 and hence to a decrease in temperature which in practice is sufficient to prevent the vapour from being condensed on the substrate.

FIG. 4 shows a diagrammatic cross-section of a centrifuge with a vapour supply and discharge different from that described above. The carrier gas 12 mixed with vapour of the solvent 15 is passed via a pipe 18 having a moulded opening 17 into the upper part of the centrifuge 4. The gas mixture is passed into the centrifuge in such a manner that gas flows from the center along the surface 2 of the substrate 1. It has been found that liquid, which was initially present as a liquid film 30 on the surface 2 of the substrate 1, (see FIG. 2) is split up, as shown diagrammatically in FIG. 5, into a number of smaller, but thicker liquid parts 35. These parts can then be centrifuged more readily from the surface than the film 30 so that also in this case it is achieved that evaporation of the liquid 3 is limited during the treatment.

A number of silicon slices having a cross-section of about 10 cm are successively cleaned in usual solutions of HF, $NH_4OH-H_2O_2$ and $HCl-H_2O_2$ and are cleaned again additionally in an UV ozone cabinet. A silicon slice is secured on the turntable 5 of the centrifuge 4 is then wetted with 2 mls of a salt solution (in water) diluted to 0.1 M $MgCl_2$. The slice is then fully coated with an about 113 $\mu$m thick liquid film. About 1 second before the latter is rotated a vapour is passed into the centrifuge as shown in FIG. 1. The vapour is obtained from a carrier gas 12, in this example nitrogen gas, being passed through the container 14 filled with an organic solvent at about the beginning of rotation of the turntable with the vapour being passed also over the during the rotation. The following table indicates number of results.

| Exp. hr. | Carrier gas | Solvent | Vapour pressure solvent | Residual material μg/slice | | | |
|---|---|---|---|---|---|---|---|
| | | | | 17r/s | 50r/s | 8r/s | 5r/s |
| 1 | — | — | | 78 | 51 | | |
| 2 | N₂ | — | | 80 | 52 | | |
| 3 | N₂ | hexanol | 100 | 60 | 53 | | |
| 4 | N₂ | isopropanol | 4400 | 21 | 27 | | |
| 5 | N₂ | diacetone alcohol | 150 | 7 | 10 | 5 | 5 |
| 6 | N₂ | 1-methoxy-2-propanol | 1100 | 4 | 9 | 4 | 3 |
| 7 | N₂ | ethylglycol | 500 | 5 | 10 | | |
| 8 | N₂ | methyl-pyrrolidon | 30 | 26 | 34 | | |

The residual material is the quantity of material, mainly MgCl₂, which remains on the silicon slice after drying in the centrifuge. During the experiments, the temperature of the substrates was about 22° C. and that of the vapour about 20° C. In experiment No. 1, the liquid is removed from the substrate without a carrier gas mixed with a vapour being brought into contact with the substrate. The entire quantity of liquid then has been removed after about 1 minute. In experiment No. 2, only carrier gas (nitrogen) is brought into contact with the substrate. The quantity of residual material found is not changed thereby. However, the time required for removing the entire quantity of liquid becomes shorter. In the following experiments, a vapour of an organic solvent is mixed each time with the carrier gas and is brought into contact with the substrate. This is effected at four different speeds of rotation of the turntable, i.e. at 5, 8, 17 and 50 rev/sec. It appears from the table that the best results are obtained at the lowest speed of rotation (5 rev/sec). Presumably, this is due to the fact that at this low speed the contraction in parts of the liquid film described above is practically not disturbed by the rotary movement. At a higher speed of rotation, this is effected indeed by the higher centrifugal forces, as a result of Which the parts are smeared out again to a liquid film, which can be removed less readily. The best results are obtained with the vapour of diacetone alcohol and 1-methoxy-2-propanol at 5 rev/sec. The quantity of residual material is then at least a factor 20 smaller as compared with the case in which the liquid is removed at 17 rev/sec without the substrate being brought into contact with the vapour. In all the experiments mentioned above, the substrate is brought into contact with the vapour about 1 sec. before it is rotated. This time may be chosen to be longer. However, if this time becomes longer than about 15 sec. a substantial part of the water film may already have been removed by evaporation, as a result of which a larger quantity of contaminations remains on the surface. This leads to a less clean result.

We claim:

1. A method of removing liquid from a surface of a substrate comprising the steps of
   (a) placing at least one substrate having a film of a liquid on a surface into a centrifuge;
   (b) passing a vapor over said at least one substrate, said vapor being of a material chosen from a group of materials miscible with said liquid, wherein said material of said vapor is chosen from an organic solvent miscible with said liquid and, when mixed with said liquid, said material yielding a mixture having a surface tension lower than that of said liquid, and
   (c) rotating said at least one substrate in said centrifuge at a speed to centrifuge said liquid from said surface, while passing said vapor over said surface.

2. A method according to claim 1, wherein said vapor is first cooled to a temperature lower than a temperature of said at least one substrate, and said vapor is formed in an unsaturated state.

3. A method according to claim 2, wherein said vapor is passed over at least one substrate before said rotary movement.

4. A method according to claim 3, wherein said vapor is passed from 1 to 15 seconds before said rotary movement.

5. A method according to claim 4, wherein said organic solvent is chosen from one of isopropanol, 1-methoxy-2-propanol, ethylglycol and diacetone alcohol.

6. A method according to claim 4, wherein said organic solvent is chosen from one of diacetone alcohol and 1-methoxy-2-propanol.

7. A method according to claim 6, wherein said speed of rotation if about 5 to 8 rev/sec.

8. A method according to claim 1, wherein said step (b) is carried out by mixing said vapor with a carrier gas.

9. A method according to claim 8, wherein said carrier gas and said vapor are passed at a low speed near said surface of said at least one substrate.

10. A method according to claim 1, wherein said organic solvent is chosen from one of isopropanol, 1-methoxy-2-propanol, ethylglycol and diacetone alcohol.

11. A method according to claim 1, wherein said organic solvent is chosen from one of diacetone alcohol and 1-methoxy-2-propanol.

12. A method according to claim 1, wherein said speed of rotation is about 5 to 8 rev/sec.

13. A method according to claim 1, wherein said step (c) prevents reformation of said film of said liquid.

* * * * *